US008612695B2

(12) United States Patent
Moschopoulos

(10) Patent No.: US 8,612,695 B2
(45) Date of Patent: *Dec. 17, 2013

(54) BIT INVERSION IN MEMORY DEVICES

(75) Inventor: Anthony Moschopoulos, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/563,397

(22) Filed: Jul. 31, 2012

(65) Prior Publication Data

US 2012/0297153 A1    Nov. 22, 2012

Related U.S. Application Data

(63) Continuation of application No. 11/460,371, filed on Jul. 27, 2006, now Pat. No. 8,239,636, which is a continuation of application No. 09/944,993, filed on Aug. 30, 2001, now Pat. No. 7,549,011.

(51) Int. Cl.
*G06F 12/00* (2006.01)

(52) U.S. Cl.
USPC .............. 711/154; 711/103; 709/203; 710/20

(58) Field of Classification Search
USPC ...................... 711/103, 154; 709/203; 710/20
See application file for complete search history.

(56) References Cited

U.S. PATENT DOCUMENTS

| 5,761,700 A | 6/1998 | Cozart et al. |
|---|---|---|
| 5,873,112 A | 2/1999 | Norman |
| 5,890,005 A | 3/1999 | Lindholm |
| 5,996,043 A | 11/1999 | Manning |
| 6,047,352 A | 4/2000 | Lakhani et al. |
| 6,175,894 B1 | 1/2001 | Manning |
| 6,292,868 B1 | 9/2001 | Norman |
| 6,321,356 B1 | 11/2001 | Snodgrass et al. |
| 6,370,627 B1 | 4/2002 | Manning |
| 6,490,703 B1 | 12/2002 | De la Iglesia et al. |
| 6,519,675 B1 | 2/2003 | Manning |
| 6,542,569 B2 | 4/2003 | Manning |
| 6,633,951 B2 | 10/2003 | Cohen |
| 6,643,730 B2 | 11/2003 | Okumura et al. |
| 7,549,011 B2 | 6/2009 | Moschopoulos |
| 8,239,636 B2 | 8/2012 | Moschopoulos |
| 2001/0014908 A1 | 8/2001 | Lo et al. |
| 2001/0054141 A1 | 12/2001 | Snodgrass et al. |
| 2002/0131313 A1 | 9/2002 | Morzano et al. |
| 2002/0186608 A1 | 12/2002 | Morzano et al. |
| 2003/0028672 A1 | 2/2003 | Goldstein |
| 2006/0259716 A1 | 11/2006 | Moschopoulos |

*Primary Examiner* — Matthew Bradley

(74) *Attorney, Agent, or Firm* — Schwegman, Lundberg & Woessner, P.A.

(57) ABSTRACT

Bit inversions occurring in memory systems and apparatus are provided. Data is acquired from a source destined for a target. As the data is acquired from the source, the set bits associated with data are tabulated. If the total number of set bits exceeds more than half of the total bits, then an inversion flag is set. When the data is transferred to the target, the bits are inverted during the transfer if the inversion flag is set.

Alternatively, an acquired data stream includes an association with an inversion bit. The inversion bit is acquired and stored separately from the data stream. As the data stream is transferred, if the inversion bit is set then the stream is inverted during the transfer of the stream to a target.

20 Claims, 8 Drawing Sheets

BIT INVERSION IN MEMORY DEVICES

CROSS-REFERENCE TO RELATED APPLICATION

The present Application is a continuation of, claims priority to, and is presently co-pending with U.S. Ser. No. 11/460,371 entitled "Bit inversion in Memory Devices," filed on Jul. 27,2006, which presently stands allowed and is set to issue as U.S. Pat. No. 8,239,636 on Aug. 7, 2012; U.S. Ser. No. 11/460,371 is a continuation of and claims priority to U.S. Ser. No. 09/944,993 entitled "Bit Inversion in Memory Devices," filed Aug. 30, 2001, which issued as U.S. Pat. No. 7,549,011 on Jun. 6, 2009; and the disclosures of all these are incorporated by reference herein in their entireties.

TECHNICAL FIELD OF THE INVENTION

The present invention relates generally to data transfers in memory devices, and in particular, the present invention relates to bit inversions on data transfers occurring between memory devices.

BACKGROUND OF THE INVENTION

In a memory device it is desirable to read and write data in the fastest manner possible while using the least amount of current or power as possible. As such, multiple bytes of data are often written to or read from one memory device to another memory device during a single operation. For example, during a write operation the data bits which are charged can draw current from the memory device while the data is stored. Thus, the more bits associated with the data that are set (e.g., charged having a value of "1"), the more power expended by the memory device during the write operation. However, it will be readily appreciated by those skilled in the art that some technology, which permits the programming of bits which are not set, such as NAND memory, can draw current during a write operation for bits that are not set (e.g., having a value of "0").

With the recent explosion in consumer demand for miniaturized portable devices (e.g., digital cameras, portable audio players, personal digital assistants, digital phones, and the like), the ability to efficiently program data in these devices and to minimize the power usage associated with these devices are of increasing importance. This is particularly important in flash memory devices, where the performance speed of the flash memory is adversely affected by the availability of an adequate power supply during write operations. Flash memories include arrays of flash cells, or transistors, that are electrically programmed using relatively high drain and gate bias voltages. However, designers of electrical systems that incorporate flash memories prefer not to include high voltage supplies in the electrical systems in order to reduce electrical system cost and power consumption. As a result, flash memories are designed for use with low voltage supplies having voltages, for example, as low as three volts.

Flash write operations require a relatively substantial current. For example, it is common to use 500 microamps per memory cell during a write operation. A two-byte write operation, therefore, requires 8 milliamps of current at a six-volt power supply. This power is not a major concern where an external Vpp supply is available. However, in low voltage memory devices the availability of this external supply is often eliminated. Thus, the flash memories are also designed to include charge pumps to create the required higher Vpp supply voltages. In addition, internal Vpp supply generators or charge pumps are limited, primarily due to economic reasons, in the amount of current which can be provided during write operations.

Conventional charge pumps can simultaneously program only relatively few flash cells. The number of memory cells, therefore, written during one write cycle is reduced into segments. One typical 16-bit programming operation is performed 4 bits, rather than 16 bits, at a time. This segmented programming operation significantly increases the programming time of flash memories. For example, a flash memory which is specified to operate a three volt power supply may be limited to writing 4 bits of data at once. To write two bytes of data, four separate write operations are required. Similarly, a flash memory which is specified to operate at six volts may be limited to writing one byte of data at once.

To reduce the current associated with programming memory, the bits associated with the data may be buffered into packets and stored in a volatile memory storage within the memory device. Next, the packets in the volatile memory are interrogated to determine the total number of set bits within each packet. If the total set bits within a packet exceeds more than half the total bits contained within the packet, then the packet is inverted before it is programmed or transferred to a non volatile storage associated with the memory device. In this way, the current draw is reduced during the write operation. However, each data packet is passed over twice, namely with a first pass that buffers the packet in a volatile storage and then with a second pass that evaluates the packet to determine whether or not an inversion on the packet needs to occur. Accordingly, the process requires excess current to perform the second pass and it further creates unnecessary latency during the data transfer.

Alternatively, some memory devices elect not to buffer the data as it is transferred from a source to a target (e.g., non volatile storage). This reduces the need for a volatile storage during the data transfer, but does not necessarily increase the performance associated with the data transfer since, as will be apparent to those skilled in the art, if the data being transferred has more than half of its data bits set, then the current draw will be increased to perform the storage in the non volatile storage. Correspondingly, memory devices which do not buffer the data during a data transfer consume greater amounts of power.

As is readily apparent any improvements, associated with the transfer speed and the current draw occurring during a data transfer to a non volatile storage in a memory device, is highly desirable and significant. Memory devices continue to be miniaturized requiring sub-lithographic dimensions of the electro-mechanical structures comprising the devices. At the same time, these devices are performing more complex operations and demanding less power.

Therefore, there is a need to reduce the data transfer time occurring within a memory device, particularly a flash memory device. For the reasons stated above, and for other reasons stated below which wilt become apparent to those skilled in the art upon reading and understanding the present specification, there is a need in the art for a memory device which can operate using a low voltage supply having an increase data transfer throughput during data transfer operations.

For the reasons stated above, and for other reasons stated below which will become apparent to those skilled in the art upon reading and understanding the present specification, there is a need in the art for alternate implementations.

DETAILED DESCRIPTION OF THE INVENTION

Figure 1:
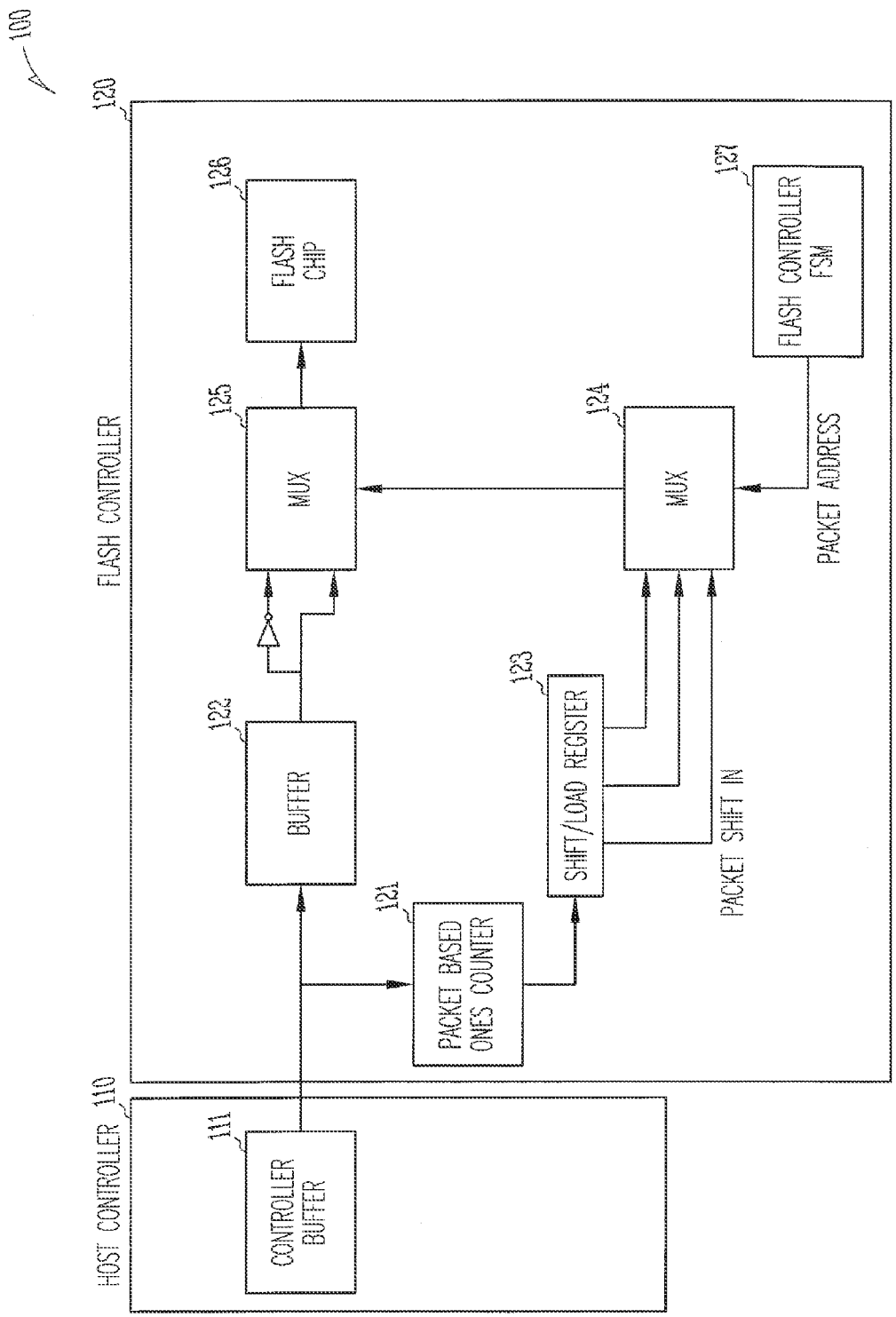
FIG. 1 is a memory system for transferring a data stream according to the teachings of the present invention.

In the following detailed description of the invention, reference is made to the accompanying drawings which form a part hereof, and in which is shown, by way of illustration, specific embodiments in which the invention can be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The term "data stream" as used in this application is intended to be any data packet whether fixed or variable. At its lowest level the data included within a data stream includes a sequence of bits, with each bit either set (e.g., value of "1") or unset (e.g., value of "0"). However as will be appreciated by those skilled in the art, memory or processing devices typically deal with data packets in byte (8 bits) chunks that combine to form words, the words are in lengths that are an exponential of 2 (e.g., $2^5$ or 32, $2^6$ or 64, and the like).

With fixed length data packets, the size of the packet is constant and does not vary. Conversely, a variable length packet reserves bits or bytes at the start of the data packet indicating the length of the packet which follows. Typically, flash memory devices are programmed to handle fixed length data packets, since such a data arrangement requires less processing overhead in determining the length of each packet as it is processed. Furthermore, a fixed length data packet conserves space within each packet, since there is no need to reserve bits that are needed to resolve the data packet length.

Moreover although flash memory devices primarily benefit from the present invention, any memory device could benefit from the present invention such as standard computing devices interfacing with other devices while the devices are operating off of battery power and correspondingly the current draw becomes vitally important. In this regard, it is apparent that the tenets of the present invention can be readily achieved with executable instructions, as opposed to electro-mechanical devices.

Yet, with flash memory devices the tenets of the present invention are more efficiently achieved by using electro-mechanical devices, since executable instructions can take up valuable non volatile storage space and further require additional processing. And, in some situations the use of both electro-mechanical devices combined with executable instructions may be deemed the best approach. Accordingly, the present invention embraces all implementations, now known or hereafter developed, which efficiently transfers data between memory devices using bit inversion techniques presented herein.

FIG. 1 shows a memory system 100 for transferring a data stream. The system 100 includes a host controller 110 having a controller buffer 111 and a flash controller 120 having a packet-based ones counter 121, a buffer 122, a shift/load register 123, two multiplexors 125 and 125, a flash controller finite state machine 127, and a flash chip 126. A data source, such as controller buffer 111, transfers a data stream from a host controller 110 to a flash controller 120. The transfer of the data stream is intercepted such that each bit associated with the data stream is inspected by a packet-based ones counter 121 as it is transferred to the buffer 122.

Next, for each data stream transferred the bits associated with that stream are counted and if the total number of set bits exceed the total bits contained in the data stream, then an inversion bit is set and shifted to the shift/load register 123, otherwise an inversion bit is unset and shifted to the shift/load register 123. Once several data streams have been received to fill the capacity of the buffer 122, the data stream is ready to be transferred to the flash chip 126. During the transfer process, the finite state machine 127 acting in connection with the multiplexors 124 and 125, inverts bits associated with data stream if an inversion bit is detected from the shift//load register 123 during the transfer. Moreover, the inversion bit itself is inserted into the data stream as it is transferred to the flash chip 126.

Figure 2:
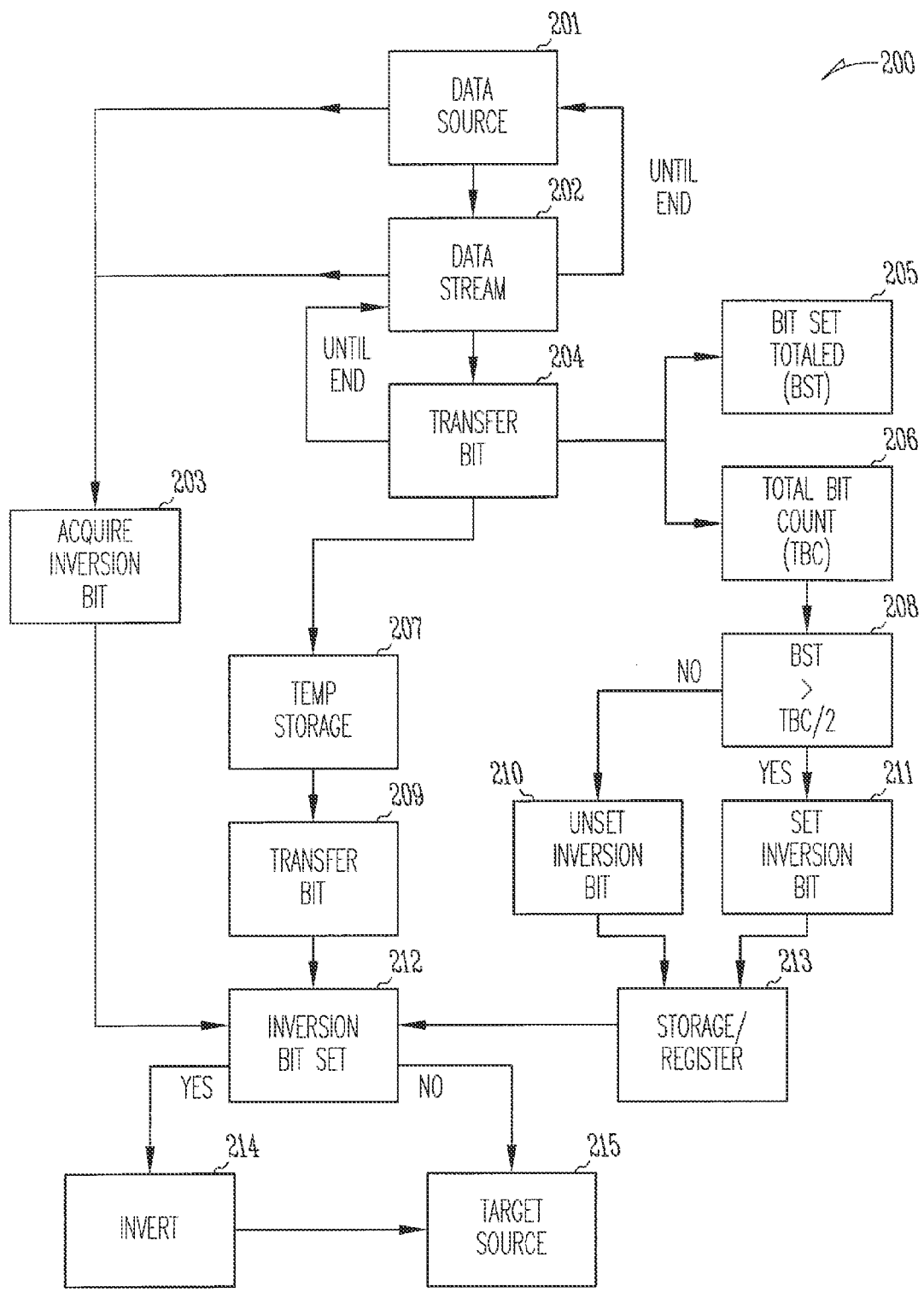
FIG. 2 is a flowchart of methods for transferring a data stream according to the teachings of the present invention.

FIG. 2 shows one flowchart for methods 200 of transferring a data stream. Initially in a first method 200, at step 201 a data source is interfaced with a target source. A data source may include, by way of example only, any host controller or memory device having data which needs to be transferred to a target source. A target source can itself, by way of example only, be a target controller or memory device. For example, a data source can be the host controller associated with a digital camera, wherein the data is image data associated with a captured image within the host controller.

In step 202, a data stream is acquired from the data source. As previously presented, the data stream may include any sequence of bits in fixed or variable length chunks. In the present example, the data stream can include a chunk of data having a fixed length, e.g. of 12 bytes, of data associated with the captured image data, wherein the captured image data has a total size of several megabytes. As depicted in method 200, the data stream is repetitively received until the end of the data associated with the data source is received.

As the data stream is transferred, each bi is received in step 204. Reception of each bit can be buffered in a volatile memory, although any storage will suffice including non volatile memory. Furthermore as each bit is received, the received bit is inspected and if the bit is set (e.g., having a value of "1"), then a counter records a bit set total (BST) in step 205 associated with the data stream. Moreover, a total bit count (TBC) can be recorded in step 206. Of course, it will be appreciated that a TBC may not be tracked at all in fixed length data streams since this will be readily known and correspondingly devices implementing method 200 will be hardcoded or hardwired to readily acquire the value of a data stream's TBC.

In FIG. 2, each bit is transferred in step 204 until the end of a complete data stream is received within a temporary storage in step 207. Next, a conditional logic in step 208 determines if the BST is greater than the TBC divided by half. And, if the evaluation of this expression is true, then an inversion bit is set in step 211, but if the evaluation of the expression is false, then the inversion bit is unset in step 210. The inversion bit is then stored in a storage or a register of a device in step 213, and readily associated with the data stream from which it is calculated. For example, a temporary storage can be equipped to handle 16 data streams or packets at one time and a shift register can include a single two-byte word, with each bit being associated with a single unique data stream. However, recording the inversion bit with the data stream in the non volatile memory will require at least one bit within the data stream to draw current. However with the method 200 presented above, it can be assured that no more than half the bits associated with a data stream will in fact be set. Thus, a 256 bit data stream will at most have 128 bits set. This provides reliability to memory devices and permits more programming of data within such devices, without incurring additional power usage.

After at least one complete data stream is received within the temporary storage and an associated inversion bit is stored within a storage or a register, the data stream can be transferred to a target source. As each bit within the temporary storage is transferred to a target source, the inversion bit is inspected in step 212, and if it is set the transferred bit is inverted in step 214, if it is not set the bit transfers normally. Upon completion, the target source in step 215 includes the data stream as it appeared when originally sent from the data source, or in an inverted format.

Continuing with the present example, the captured image is transferred to a target source, such as a compact flash card or a multimedia card (e.g., target source). In this way, the digital camera (e.g., data source) captures the image data, and the data can be transferred fixed byte streams to a volatile memory. As it is transferred each stream, is assigned a calculated inversion bit based on an BST which is tabulated in parallel as the stream is transferred to the volatile memory. Next, the stream is transferred to the compact flash or multimedia card and inverted as it is transferred if the inversion bit associated with the stream is set. As is apparent, this results in less power consumption during the data transfer, and correspondingly the throughput associated with data transfer is increased.

Further, the data stream transferred in method 200 to a target source may itself include a reserved bit for the inversion bit of the present invention, or alternatively a separate data stream which is readily identifiable within the target source can be used to record which data streams within the target source are streams which have been inverted. In this way, when the data streams are read from the target source any restoring inversion may be readily achieved as needed.

Alternatively, FIG. 2 shows another method 200 of transferring a data stream, wherein a data source includes data streams which have previously underwent an inversion method 200, as discussed above. In this situation, what was previously discussed as being the data target is now a data source, and what was previously discussed as being a data source is now a data target. In the present example, the compact flash or multimedia card (e.g., data source) is inserted into a digital camera (e.g., target source) for purposes of displaying an image contained on the card within a display associated with the camera. Therefore, target and source are relative and transitory being resolved with the operation (e.g., read or write operation) being performed within the memory devices.

Again, in step 203 a data stream and its associated inversion bit are acquired, with the inversion bit inspected in step 212. If the inversion bit is set then in step 214 the data stream is inverted as it is transferred to the target source in step 215, otherwise the data stream is transferred normally to the target source.

Figure 3:
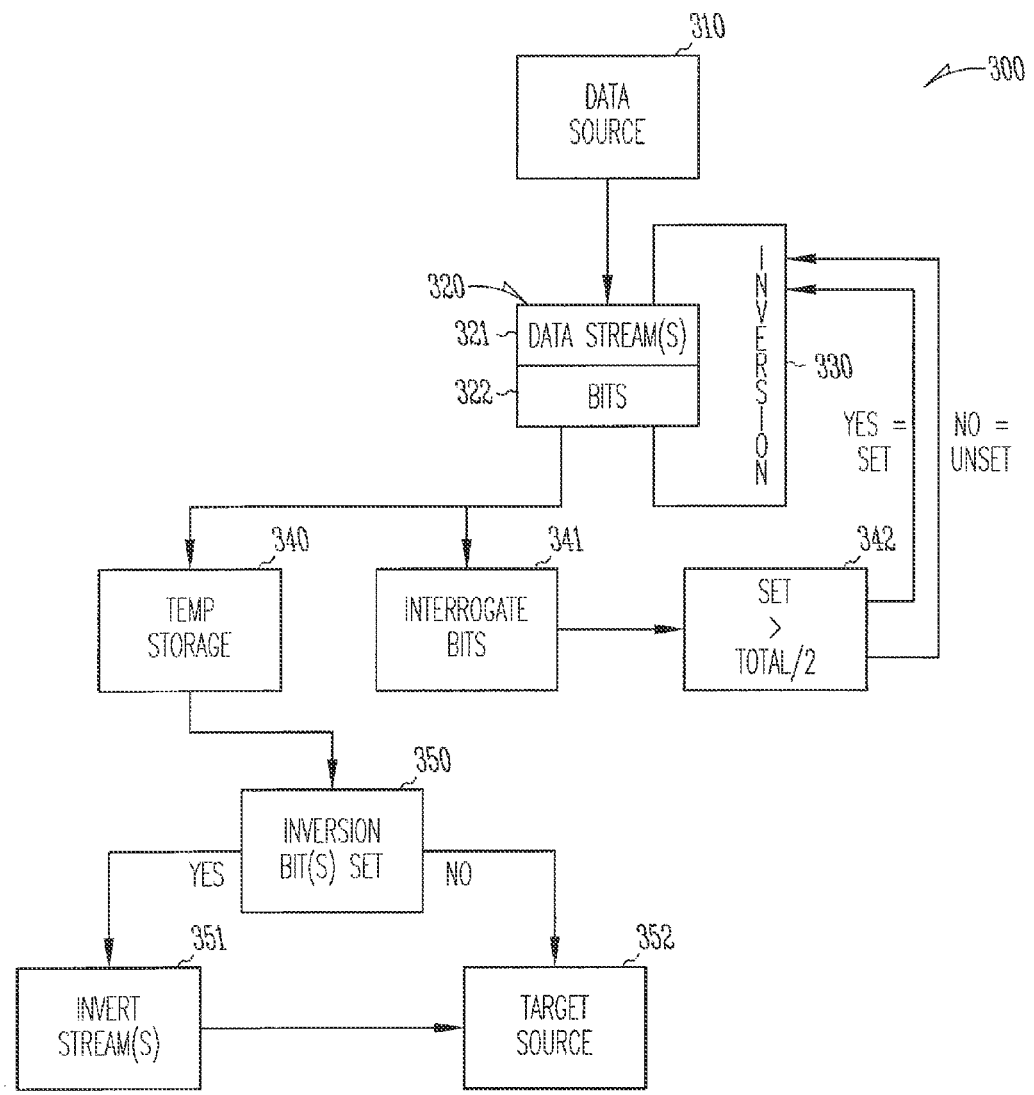
FIG. 3 is a schematic diagram of functional data operable to be inverted according to the teachings of the present invention.

FIG. 3 shows a schematic diagram 300 of functional data 320 operable to be inverted. The functional data 320 includes one or more data streams 321 with each data stream 321 having a plurality of bits 322 and each data stream 321 associated with an inversion bit 330. The functional data 320 is received from a data source 310, and each bit 322 associated with a single data stream 321 is transferred to a temporary storage in step 340 and interrogated in step 341. Moreover, a total number of set data stream bits is tabulated and compared in step 342 to the total number of bits within the data stream 321, such that if the total number of set bits exceeds more than half of the total number of bits in step 342 then the inversion bit 330 associated with the data stream 321 is set, otherwise the inversion bit 330 is not set.

Further, as the data stream 321 is transferred from the temporary storage in step 340, the calculated inversion bit 330 is inspected in step 350 and if the inversion bit 330 is set, then the data stream 321 is inverted in step 351 as it is transferred to a target source in step 352. Moreover, the temporary storage can house one or more data streams 321 and one or more inversion bits 330 associated therewith. In this way, the data streams 321 can be optimally buffered within the temporary storage.

As is apparent, the functional data 320 can be logically associated in any manner within a computer readable medium, such as and by way of example only, a stream of data with a reversed bit to identify whether an inversion is to take place, or as a data structure (e.g., tree, linked list, and the like) with the reserved bit or flag separately stored in a different structure or different location (e.g., remote storage). Of course, the reserved inversion bit or flag can be included within the data structure itself.

Figure 4:
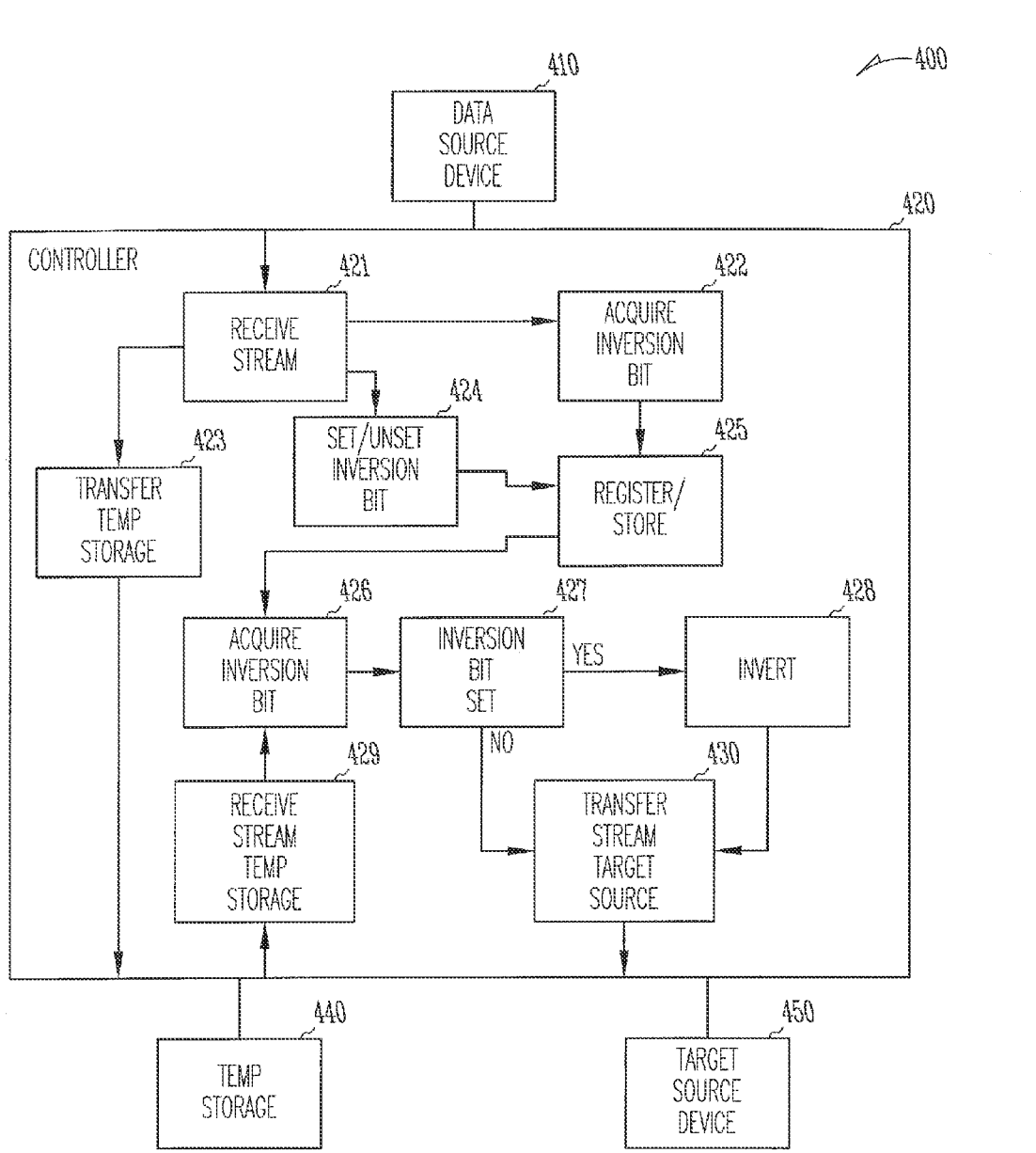
FIG. 4 is a schematic diagram of inversion data transfer systems according to the teachings of the present invention.

FIG. 4 is one schematic diagram of inversion data transfer systems 400. One system 400 includes a data source device 410, a temporary storage 440, a target source device 450, and a controller 420. As previously presented, the data source device 410 can itself be a host controller, having a controller storage buffer. Moreover, although FIG. 4 depicts a single controller 410, it is readily appreciated that a single controller 410 is not required, as one or more controllers can be used and interfaced with one another to achieve results of a single controller. For example, controller 420 of FIG. 4 can be designed to include a receiving controller, a counting controller, and a transferring controller without departing from the present invention.

Further as is readily apparent to those skilled in the art, the data source device 410, the temporary storage 440, and the target source device 450 can be readily assembled and interfaced with the controller 420 by well known connections and techniques known to those skilled in the art such as, and by way of example only, a data bus, and the like. Also, each device depicted in systems 400 is operable to receive data requests from the controller 420, such that data is readily passed among the devices through the controller 420. An example flow of the data transfer and processing as it is handled by the controller 420, is depicted within the controller 420 of FIG. 4. Accordingly, physical configurations of controllers using electro-mechanical devices, can be readily deployed by those skilled in the art, so as to achieve the data flow depicted within controller 420 of FIG. 4.

Moreover, the controller 420 of system 400 receives a data stream in block 421, wherein the bits associated with the data stream are intercepted and the set bits associated with the data stream are tabulated in block 424, by using for example a packet based ones counter device welt known to those skilled in the art. If the total set bits within the data stream exceed more than half the total bits associated with the data stream, then a set inversion bit is set in block 424 and stored in a register or store in block 425. Again, this storage can be achieved by using a standard shift/load register, such that multiple streams are housed in a buffer within the controller 420, and each bit shifted to the register is also associated with a single stored stream.

Once one or more streams are buffered within the temporary storage 440 and a corresponding inversion bit(s) is/are associated and stored within the register or storage area in block 425, the stream(s) is/are ready to be transferred to target source device 450, after being received by the controller 420 in block 429. During this transfer, the inversion bit is acquired in block 426 from the register or storage area in block 425. Next, if the inversion bit is set in block 427, each bit associated with the data stream is inverted in block 428 as it is transferred in block 430 to the target source device 450. As one skilled in the art will appreciate, in flash memory devices this inversion can be readily achieved by using multiplexors attached to the shift/load register and the storage buffer prior to transfer to the target source device 450.

Alternatively, another system 400 of FIG. 4 shows a controller 420 which acquires an inversion bit in block 422 from the data source device 410. This inversion bit can be physically included within the received data stream in block 421 or the inversion bit can be logically associated with the received data stream in block 421, and thus acquired from the data source device 410. In this embodiment, the acquired inversion bit in block 422 is stored in a register or storage area in block 425 white the received data stream in block 421 is transferred in block 423 and optionally buffered in a temporary storage 440. Next, as the data stream is transferred to a target source device 450 the inversion bit is acquired in block 426 from the register or storage area in block 425 and inspected in block 427, such that if the inversion bit is set the data stream is inverted in block 428 and transferred in block 430 to the target source device 450, otherwise the data stream is transferred in block 430 normally to the target source device 450.

Figure 5:
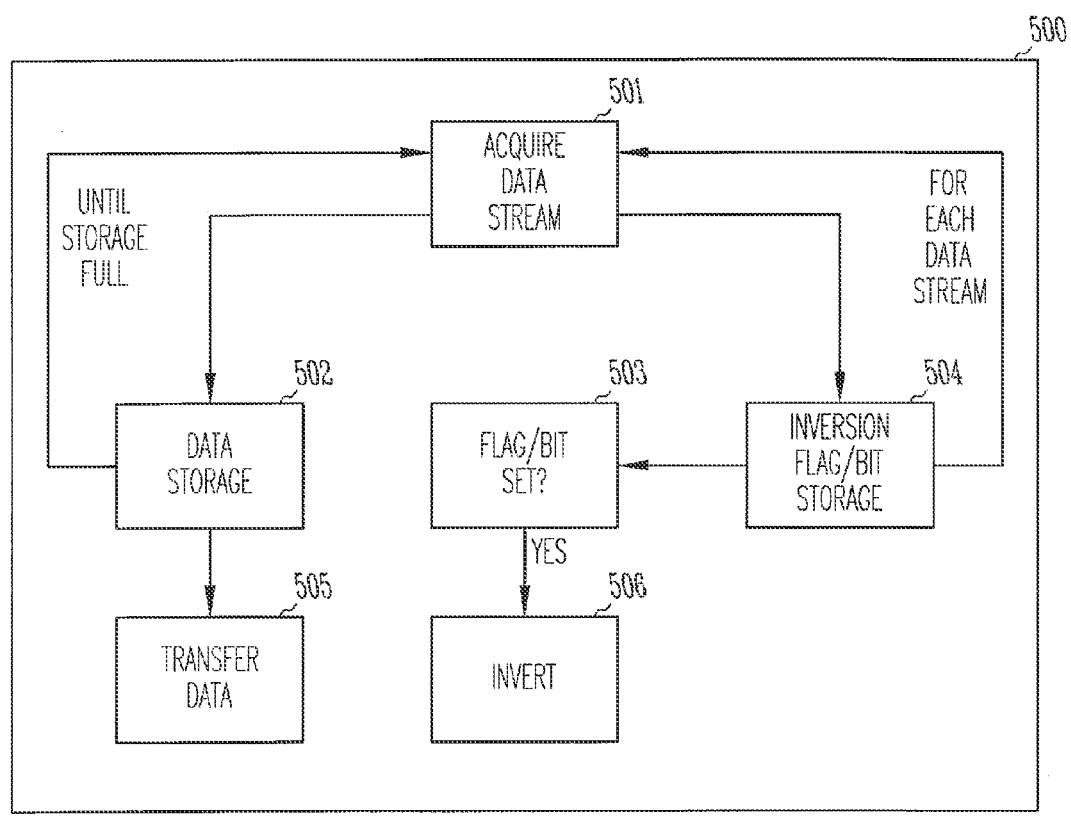
FIG. 5 is a flowchart of a method of inverting transferred data according to the teachings of the present invention.

FIG. 5 shows one flowchart for a method 500 of inverting transferred data. In FIG. 5, a set of executable instructions reside on a computer readable medium 500. Of course as will be readily apparent to those skilled in the art, the executable instructions need not reside on any single computer readable medium, as it can be that the instructions are housed on multiple computer readable media and operable to be logically associated and execute as a cohesive unit of instructions. Initially, the executable instructions acquires a data stream in step 501.

Data stream acquisition can occur from any data source device such as, and by way of example only, a host controller device having data residing thereon, a removable flash memory device having data residing thereon, and others. As this data stream is received, the bits associated with the stream are inspected in step 504 until the stream is completely received within a data storage in step 502, in order to determine whether the stream has a total number of set bits (TSB) which exceed more than half the total number of bits (TB) within the data stream, in which case a flag or bit is set (e.g., TSB>TB/2) or unset e.g., TSB<=TB/2) and associated with the data stream.

At some later point in time, the data stream is transferred, in which case the flag or inversion bit is inspected in step 503 and transferred in step 505. Further, if the flaf or inversion bit is set, then the data stream is inverted in step 506 during the transfer step occurring in step 505. As previously discussed, the data is transferred to any target device such as, and by way of example only, a host controller device, a removable flash memory device, and others.

Figure 6:
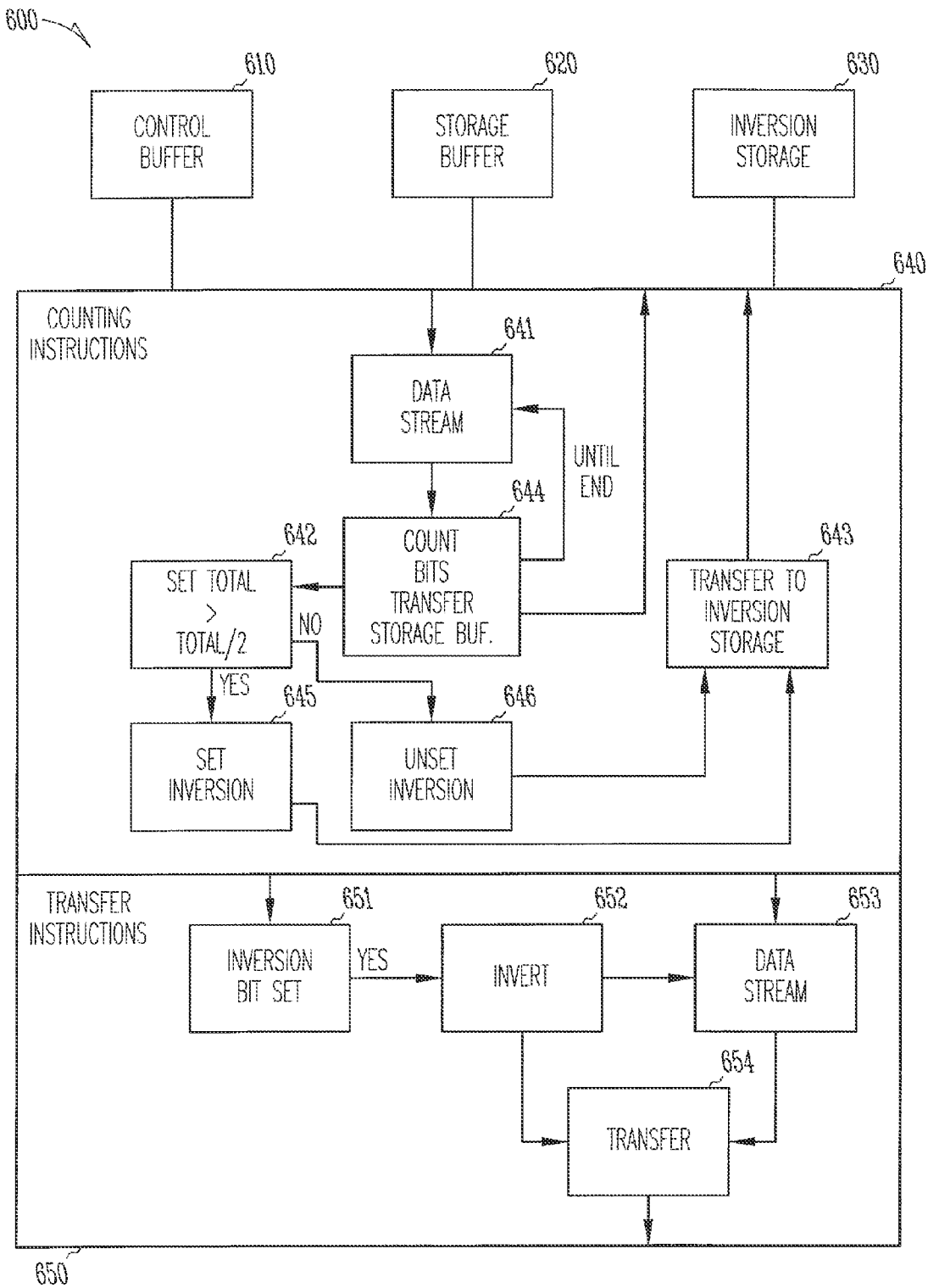
FIG. 6 is a schematic diagram of a system for transferring a data stream according to the teachings of the present invention.

FIG. 6 shows one schematic diagram for a system 600 for transferring a data stream. The system 600 includes a control buffer 610, a storage buffer 620, an inversion flag storage 630, a counting set of executable instructions 640, and a transfer set of executable instructions 650. Again, the control buffer 610, the storage buffer 620, and the inversion storage 630 are readily interfaced to counting instructions 640 and transfer instructions 650 using well known techniques known in the art, such as standard device driver executable instructions permitting access to the physical devices, and the like. Data flow, as it is received by the counting instructions 640 and transfer instructions 650, is depicted in FIG. 6.

In system 600, a data stream is received in block 641 to a storage buffer 620 from a control buffer 610. Moreover, one or more streams can be received and buffered until all data within the control buffer 610 is received. The counting set of executable instructions 640, intercepts and inspects each bit as it is received to the storage buffer 620. Set bits within the data stream are counted in block 644 and simultaneously transferred to the storage buffer 620. After the data stream is completely received, a bit set total is compared in block 642 to determine if it exceeds more than half the total bits within the data stream. Appropriately, an inversion bit is set in block 645 or not set in block 646 and transferred in block 643 to the inversion storage 630.

Moreover, the transfer set of executable instructions 650 acquires an inversion bit from the inversion storage in block 630 and a data stream in block 653 from the storage buffer 620, and if the inversion bit is set in block 651 then as the data stream is transferred in block 654 it is inverted in block 652.

Figure 7:
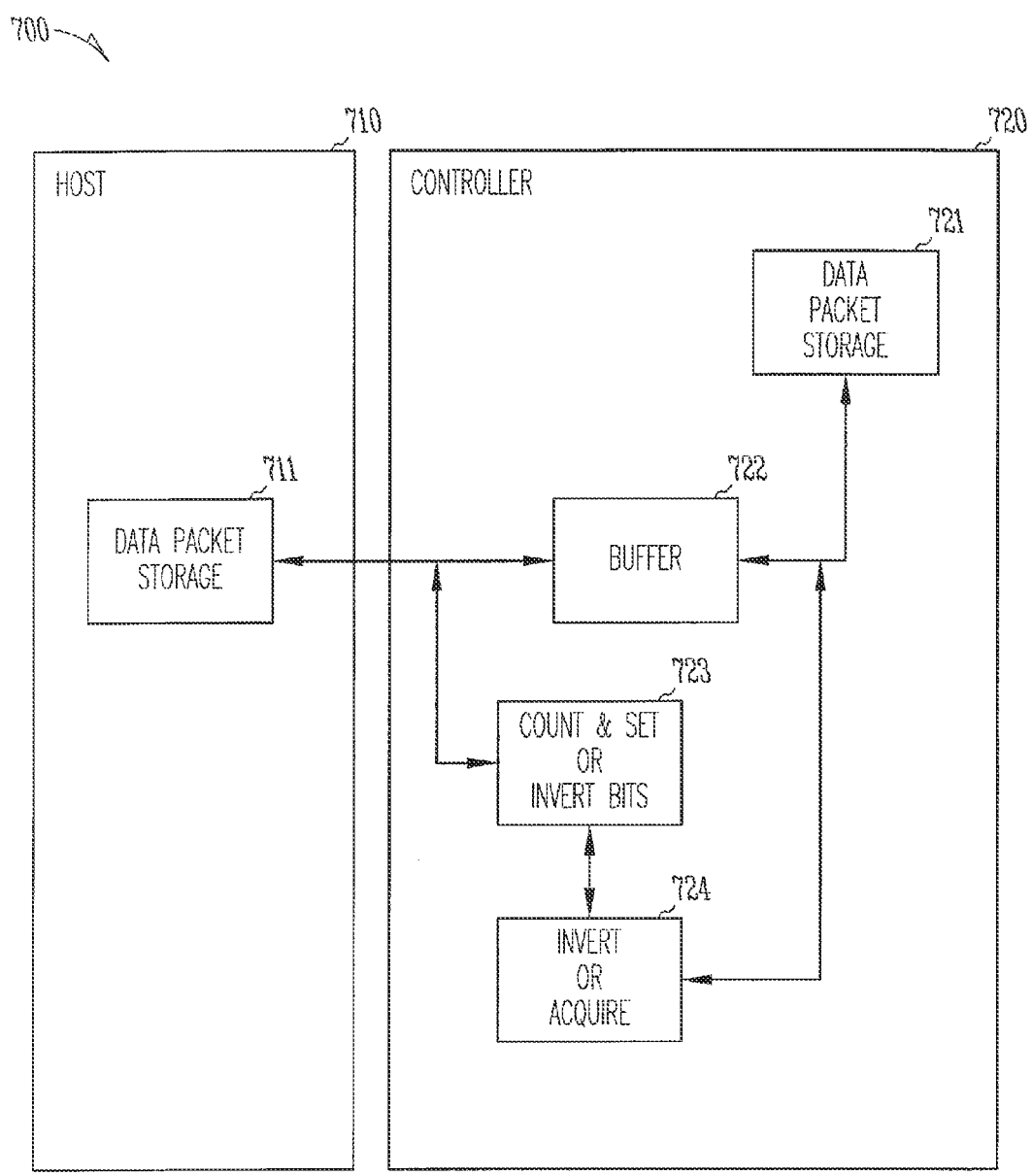
FIG. 7 is a schematic diagram of a memory apparatus according to the teachings of the present invention.

FIG. 7 shows one schematic diagram for a memory apparatus 700. The memory apparatus 700 includes a controller 720 which is operable to acquire from a host controller 710 a data packet residing in a storage in block 711 of the host controller 710. As will be appreciated, reception of the data packet may be achieved through infrared communication, hardwired communication, radio frequency communication, any wireless communication, and any hardwired communications (e.g., direct or indirect). The controller 720 receives the data packet in block 722 in a volatile memory (e.g., DRAM, SRAM, RAM, and others), or a non volatile memory (e.g., buffer, and others). As the data packet is received it is intercepted and the bits are inspected and a total set hit count tabulated in block 723. If the total set bit count exceeds more than half the total bit count associated with the packet then an inversion bit is set, otherwise the inversion bit is not set. In either case, the inversion bit is associated with the data packet.

Next, as the data packet is further transferred from a temporary storage area in block 722 to a data packet storage in block 721, if a corresponding inversion bit is set the data packet is inverted in block 724 during the transfer. Moreover, although the data packet storage is depicted, for purposes of illustration only, within the controller 720 of FIG. 7 it is readily apparent that this need not be the case, as the data storage can include removable or remote computer readable storage.

Alternatively, the controller 710 detects a data packet being transferred having an associated inversion bit in block 723 and separates the hit out from the buffer. Then in a similar manner, as the data packet is transferred from the buffer to the data packet storage in block 721, the packet is inverted in block 724 if the inversion bit is set.

Figure 8:
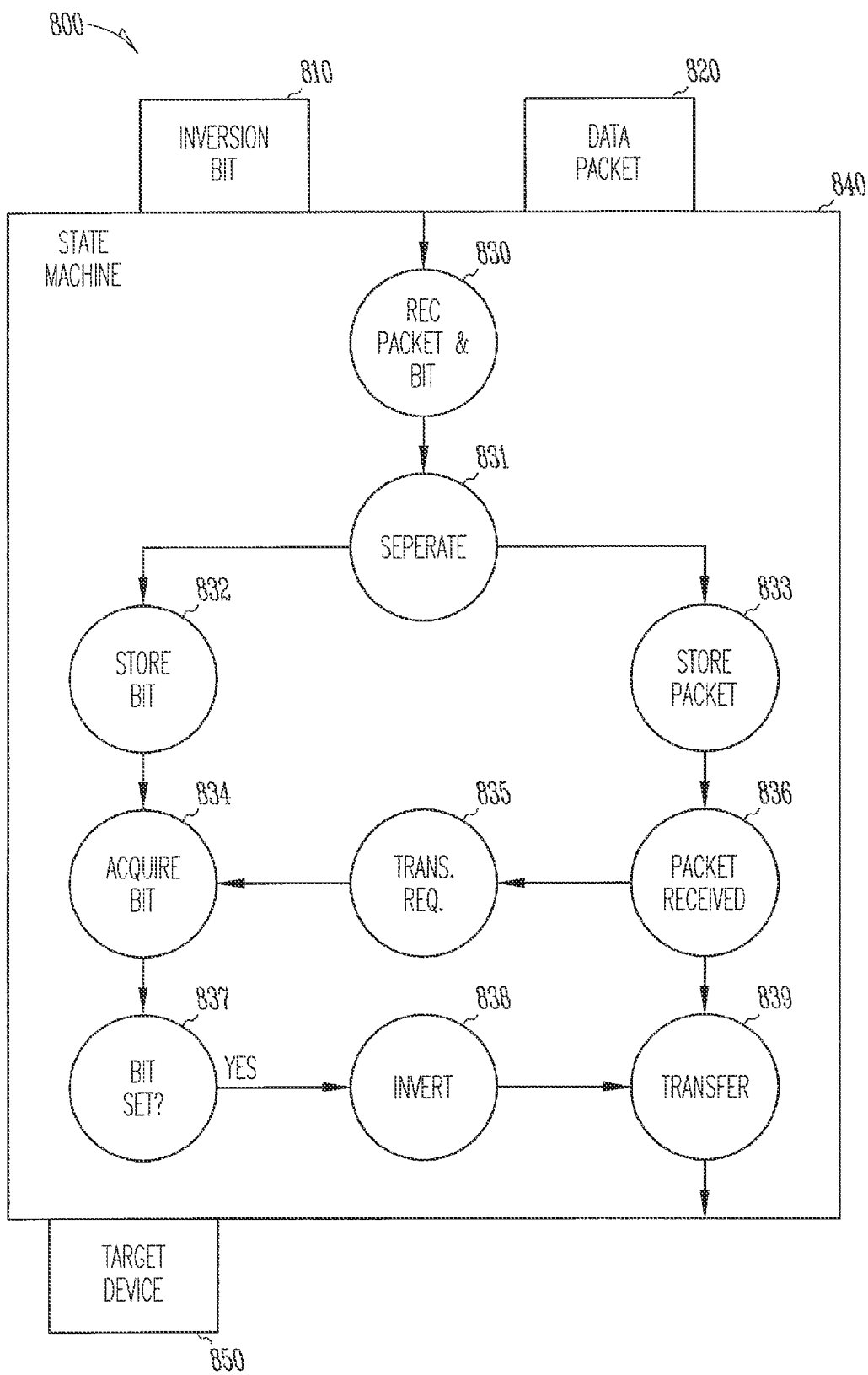
FIG. 8 is a schematic diagram of a state machine according to the teachings of the present invention.

FIG. 8 shows one schematic diagram 800 for a state machine 840. The apparatus 800 having an inversion bit 810, a data packet 820, a target device 850, and a state machine 840. The state machine 840 initially receives in step 830 a packet 820 and an inversion bit 810 where they are separated in step 831. The inversion bit 810 is stored in step 832 and the packet 820 is stored in step 833 in separate physical or logical locations. Next, once a complete packet 820 is received or detected in step 836, then a transfer request state is initiated in step 835 resulting in the inversion bit 810 being retrieved in step 834. The inversion bit 810 is queried in step 837 to determine if it is set, and if it is set the packet 820 is inverted in step 838 as it is transferred in step 839. If the inversion bit 810 is not set then it is transferred in step 838 without inversion. Transfer is made to a target device 850.

CONCLUSION

It has been shown that the efficiency and throughput associated with data transfers occurring between memory devices can be greatly improved with the present invention. Furthermore, current draw is reduced during a data transfer and correspondingly less power is consumed with the tenets of the present invention. Moreover, as discussed herein the tenets of the present invention can be readily deployed using electro-mechanical devices and/or executable instructions. Although specific embodiments have been illustrated and described herein, it will be appreciated by those of ordinary skill in the art that any arrangement which is calculated to achieve the same purpose may be substituted for the specific embodiment shown. For example, although examples presented herein refer to counting and inverting set bits associated with data, it is readily appreciated that for technology which programs unset bits (e.g., NAND, and the like), the tenets of the present invention may be easily used to count and invert unset bits. In this way, a set bit may be said to have a value of "0" and an unset bit a value of "1". This application is intended to cover any adaptations or variations of the present invention. Therefore, it is manifestly intended that this invention be limited only by the claims and the equivalents thereof.

What is claimed is:

1. A method, comprising:
   acquiring bits of a data stream from an external device to a temporary storage associated with a different device, and the temporary storage is equipped to concurrently handle multiple additional data streams with the handling of the data stream, one of which is the data stream and remaining data streams are the additional data streams;
   counting each bit and each set bit in a bit-set total as each bit is acquired from the external device and wherein the data stream remains unchanged in the external device, the data stream is the data stream being handled; and
   setting an inversion flag for the data stream when the bit-set total is more than half a total bit count for the bits.

2. The method of claim 1 wherein acquiring further includes identifying the external device as a digital camera.

3. The method of claim 1 further comprising, storing the inversion flag in a separate location from the data stream.

4. The method of claim 1, wherein setting further includes inserting the inversion flag into the data stream when the data stream is subsequently transferred.

5. A method, comprising:
   acquiring a data stream being transferred to an external and target device, the data stream is transferred to the external and target device from a temporary storage, and the temporary storage is equipped to concurrently handle multiple additional data streams with the handling of the data stream;
   inspecting an inversion flag of the data stream; and
   inverting each bit of the data stream as it is transferred to the external and target device when the inversion flag is set, and the target device includes a data stream that is different from the data stream in the temporary storage after the inverted transfer.

6. The method of claim 5, wherein acquiring further includes identifying that the external and target device and the different device include their own independent storage capabilities.

7. The method of claim 5, wherein inspecting further includes acquiring the inversion flag from storage.

8. The method of claim 5, wherein inverting further includes inserting the inversion flag into the data stream when it is transferred and some bits or bytes are reserved in the data stream to identify a length of each packet being transferred that comprise the data stream, each packet is of variable length.

9. A method, comprising:
   counting bits being received from an external device into temporary storage for a data stream, the temporary storage is equipped to concurrently handle multiple additional data streams with the handling of the data stream and the additional data streams;
   counting each bit that is set to assemble a total set-bit count; and
   setting an inversion flag for the data stream when the total set-bit count is greater than one-half of a total bit count, and the data stream of the external device is inverted and remains unchanged when transferred by one of: radio frequency, infrared, or wireless from the temporary storage to a different device when the total set-bit count is greater than one-half of the total bit count, and the inversion flag is inserted into the data stream when transferred, the data stream is the data stream being handled.

10. The method of claim 9, wherein counting further includes receiving the data stream and the additional data streams received in variable length chunks.

11. The method of claim 10, wherein receiving further includes identifying with each packet for the data stream and the additional data stream some reserved bits or bytes that identify a length for each packet, and each packet is a variable length.

12. The method of claim 9, wherein counting further includes identifying the external device and the different device as including their own independent storage capabilities.

13. The method of claim 9, wherein counting further includes assembling the total bit count while counting the bits received.

14. A method, comprising:
   receiving a request to transfer a data stream to an external target device, the data stream is transferred to the external target device from a temporary storage associated with a different device, the temporary storage is equipped to concurrently handle multiple additional data streams with the handling of the data stream;
   acquiring an inversion flag for the data stream; and
   concurrently inverting each bit of the data stream as it is transferred to the external target device when the inversion flag is set, and the external target device receives an inverted version of the data stream from that which is in the temporary storage, each bit transferred via one or more of: radio frequency, infrared communication, or wireless, the data stream is the data stream being handled.

15. The method of claim 14, wherein receiving further includes identifying with each data stream a series of packets, each packet including reserved bits or bytes to indicate a length for that packet, and each packet is of variable length.

16. The method of claim 14, wherein acquiring further includes acquiring the inversion flag from a shift/load register.

17. The method of claim 14, wherein concurrently inverting further includes inserting the inversion flag into the data stream when it is transferred to the external target device.

18. A method, comprising:
   recording total bit counts for data streams being received from external devices into a buffer storage, and the buffer storage is associated with a different device from that which is associated with the external devices, the buffer storage is equipped to concurrently handle multiple additional data streams with the handling of the data stream;
   counting total set-bit counts for the data streams representing total bits set within the data streams, a separate total set-bit count maintained for each of the data streams, the data streams are the data streams being handled;
   generating and assigning values to inversion flags for the data streams; and
   setting the assigned values for the inversion flags in response to whether a given data stream has a total bit-set count that exceeds half of the its total bit count, and the data streams of the external devices remains unchanged and is inverted when wirelessly transferred from the temporary storage to the different device when the total set-bit count is greater than one-half of the total bit count.

19. The method of claim 18, wherein recording further includes identifying with each data stream multiple packets and each packet includes some reserved bits or bytes that identify a length for that packet, and each packet is of variable length.

20. The method of claim 18, wherein generating further includes housing the inversion flags in a register as a byte word.

* * * * *